United States Patent
Kodera et al.

(10) Patent No.: US 6,410,439 B1
(45) Date of Patent: Jun. 25, 2002

(54) SEMICONDUCTOR POLISHING APPARATUS AND METHOD FOR CHEMICAL/MECHANICAL POLISHING OF FILMS

(75) Inventors: Masako Kodera, Yokohama; Takashi Yoda, Machida; Motosuke Miyoshi, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,528

(22) Filed: Mar. 16, 2000

(30) Foreign Application Priority Data

Mar. 17, 1999 (JP) .......................................... 11-071607

(51) Int. Cl.$^7$ .......................................... H01L 21/302
(52) U.S. Cl. ........................ 438/691; 438/692; 438/693
(58) Field of Search ................................. 438/691, 692, 438/693, 694; 451/6, 8, 41, 63

(56) References Cited

U.S. PATENT DOCUMENTS 5,081,796 A * 1/1992 Schultz ..................... 51/167.74
5,838,447 A * 11/1998 Hiyama et al. ............. 356/381
5,964,643 A   10/1999 Birang et al. ................... 451/6
6,102,775 A *  8/2000 Ushio et al. .................... 451/6

FOREIGN PATENT DOCUMENTS

JP     11-198033     7/1999

* cited by examiner

Primary Examiner—Benjamin L. Utech
Assistant Examiner—Lan Vinh
(74) Attorney, Agent, or Firm—Finnegan, Henderson, Farabow, Garrett & Dunner, L.L.P.

(57) ABSTRACT

In the CMP of films of semiconductor devices, pulsed measuring radiation is directed onto a surface to be polished of a rotating wafer. At this point, the pulse repetition rate of the pulsed measuring radiation is determined so that the pulse measuring radiation is directed only onto a specified portion of the surface of each semiconductor device. Thereby, reflection data can be obtained only from the specified portion of a film to be polished, allowing accurate measurements of the thickness of the specified portion of the film in the middle of polishing.

3 Claims, 4 Drawing Sheets

SEMICONDUCTOR POLISHING APPARATUS AND METHOD FOR CHEMICAL/ MECHANICAL POLISHING OF FILMS

CROSS-REFERENCE TO RELATED APPLICATIONS

This application is based upon and claims the benefit of priority from the prior Japanese Patent Application No. 11-071607, filed Mar. 17, 1999, the entire contents of which are incorporated herein by reference.

BACKGROUND OF THE INVENTION

The present invention relates to a semiconductor polishing apparatus and method for polishing films using chemical/mechanical methods to obtain a smooth surface. More specifically, the present invention relates to a CMP (Chemical/Mechanical Polishing) apparatus and method which allow measurements of the thickness of films in the middle of polishing.

One method to remove surface irregularities of a film deposited over the surface of semiconductor devices is CMP technology. The CMP is to polish the surface of a film using chemical/mechanical methods. In the CMP, for good control of the residual thickness of a film after polishing, there has been demand for knowledge of the film thickness in the middle of polishing.

FIG. 1 shows a prior art. For example, a wafer 103 in the middle of manufacturing process for semiconductor devices is placed on a polishing cloth 102 attached to the surface of a polishing platen 101. The wafer 103 is then held by a top ring 104 with the to-be-polished surface (in which a device is manufactured) down. At the time of polishing, the top ring 104 is rotated by a motor 116. The polishing platen 101 is rotated by a motor 115.

A film thickness measuring hole 105 is formed in the polishing platen 101 and the polishing cloth 102. A measuring radiation irradiation device 106 and a film thickness measuring instrument 107 are placed below the measuring hole 105 formed in the platen 101. At the time of measurement, the radiation irradiation device 106 emits visible light toward the film of the wafer 103. The measuring instrument 107 receives and analyzes reflected light from the film of the wafer 103 to measure the film thickness in the middle of polishing.

With this method, however, information (film thickness) can be obtained only from unspecified portions of the surface of the semiconductor device because the wafer 103 is rotating. Therefore, the thickness of specified portions of the film cannot be known accurately and difficulties are involved in controlling the residual thickness of the film.

Another method is to allow a wafer to protrude its portion from a polishing platen and direct visible light to that portion of the wafer. However, this method also has the problem that information can be obtained only from unspecified portions of the surface of the semiconductor device.

Thus, with the conventional methods, it is impossible to control strictly the amount by which the film is polished, which results in short or excessive polishing and consequently in the formation of form defects, such as dishing, thinning, and rounding.

In addition, analysis software to measure the film thickness is complex in processing. Thus, the instrument has to be tailored each time the analysis software is updated, making the apparatus management complex.

BRIEF SUMMARY OF THE INVENTION

It is an object of the present invention to provide a semiconductor polishing apparatus and method which allow the residual thickness of a film to be polished in the surface of semiconductor devices manufactured on a wafer to be controlled well and provides ease of management.

According to an aspect of the present invention there is provided a semiconductor polishing apparatus comprising: a polishing platen to which a polishing cloth is attached; a wafer holder for holding a wafer so that a surface to be polished of it is opposite to the surface of the polishing cloth; a measuring radiation irradiation device for directing pulsed measuring radiation onto the surface to be polished of the wafer in the middle of polishing; a data processor for determining the pulse repetition rate of the measuring radiation emitted by the measuring radiation irradiation device; and a film thickness measuring device responsive to reflections of the pulsed measuring radiation from the surface to be polished of the wafer for measuring the thickness of a film to be polished present at the surface to be polished of the wafer.

According to another object of the present invention there is provided a semiconductor polishing method comprising the steps of: setting a surface to be polished of a wafer held by a wafer holder opposite to the surface of a polishing cloth attached to the surface of a polishing platen; supplying the surface of the polishing cloth with a polishing slurry; polishing a film present in the surface of the wafer by bring the surface of the polishing cloth and the surface of the wafer into contact with each other with a load applied to the wafer; irradiating the surface of the wafer with pulsed measuring radiation at the time of polishing from a measuring radiation irradiation device; determining the pulse repetition rate of the pulsed measuring radiation by a data processor; and measuring the thickness at a specified site of the film in the middle of polishing on the basis of reflections of the pulsed measuring radiation from the surface of the wafer by a film thickness measuring device.

According to still another aspect of the present invention there is provided a semiconductor polishing method comprising the steps of: setting a surface to be polished of a wafer held by a wafer holder opposite to the polishing surface of a polishing platen; rotating the polishing platen and the wafer holder by first and second motors, respectively; irradiating the surface of the wafer with pulsed measuring radiation at a pulse repetition rate calculated from the numbers of rotations of the first and second motors; and measuring the thickness of a specified portion of a film present in the surface of the wafer in the middle of polishing on the basis of reflections of the pulsed measuring radiation from the surface of the wafer.

The present invention allows the thickness of a specified portion of a film to be polished in the surface of semiconductor devices to be measured accurately. Thus, the amount by which a film is polished can be controlled strictly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

A semiconductor polishing apparatus according to a first embodiment of the present invention will be described with reference to FIG. 2.

Figure 1:
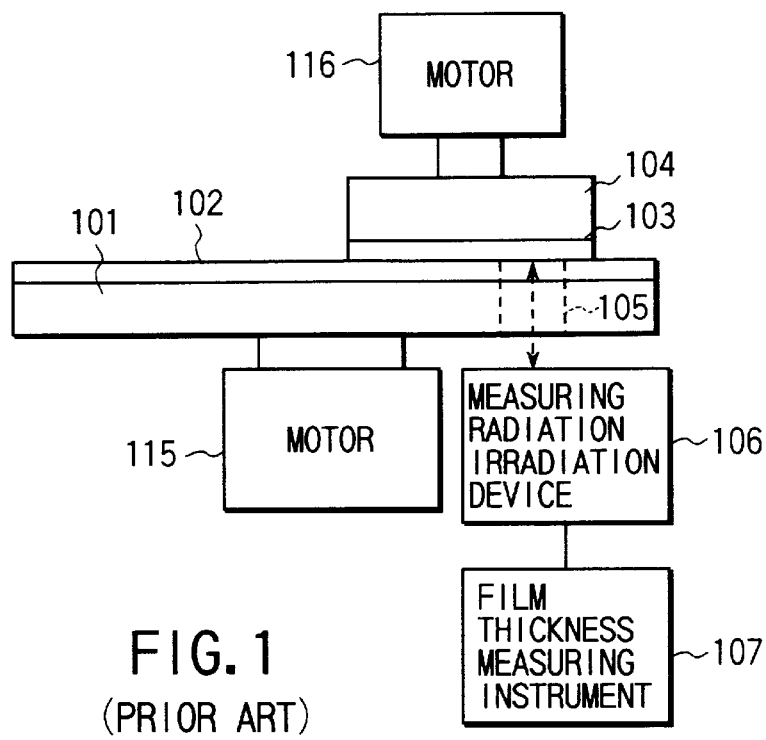
FIG. 1 is a schematic illustration of a conventional semiconductor polishing apparatus.
Figure 2:
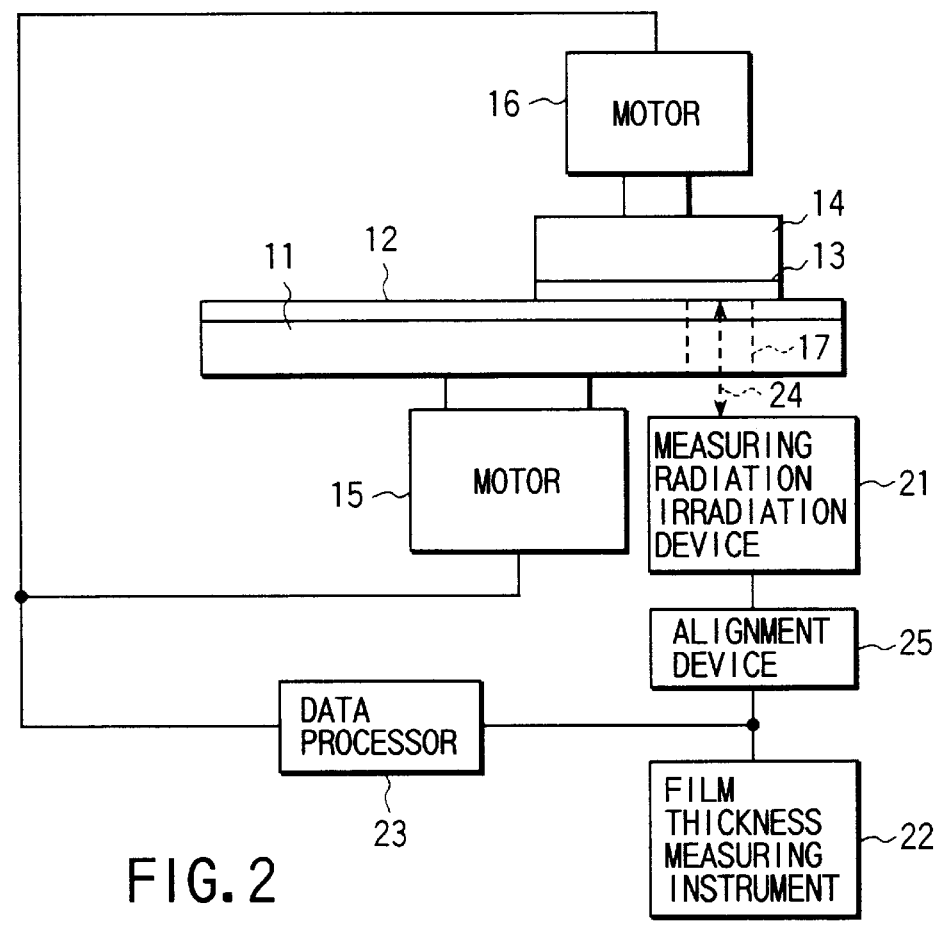
FIG. 2 is a schematic illustration of a semiconductor polishing apparatus according to a first embodiment of the present invention.

As shown in FIG. 2, a polishing cloth 12 is attached to the surface of a polishing platen 11. On the polishing cloth 12 is placed a wafer 13 in the middle of the manufacturing process of semiconductor devices. The wafer 13 is held by a top ring 14 as wafer holding means with the surface to be polished down. The top ring 14 is rotated by a motor 16 and the polishing platen 11 is rotated by a motor 15. At the time of polishing, though not shown, a polishing slurry is supplied between the polishing cloth 12 and the wafer 13.

In a given portion of the polishing platen 11, a film thickness measuring window 17 is formed through the polishing cloth 12. A measuring radiation irradiation device 21 is placed in that position below the polishing platen 11 which allows light emitted by it to be directed onto the wafer 13 through the measuring window 17. To the measuring radiation irradiation device 21 is coupled an alignment device 25 which, in turn, is coupled with a film thickness measuring instrument 22 and a data processor 23. The motors 15 and 16 are electrically connected with the data processor 23.

The measuring radiation irradiation device 21 irradiates the surface of the wafer 13 that is rotating with pulsed beams of light (the film thickness measuring radiation) through the film thickness measuring window 17. The alignment device 25 is adapted to adjust the position of the measuring radiation irradiation device 21 relative to the wafer 13. The film thickness measuring instrument 22 measures the thickness of a polished film of the wafer 13 in the middle of polishing by analyzing light emitted by the measuring radiation irradiation device 21 and then reflected from the surface of the wafer 13. The data (reflection date) on the reflected light is fed into the film thickness measuring instrument 22 via the measuring radiation irradiation device 21. The data processor 23 determines the pulse repetition rate (specific frequency) of the film thickness measuring radiation emitted by the measuring radiation irradiation device 21 on the basis of the numbers of rotations of the motors 15 and 16. The method of determining the pulse repetition rate will be described later.

The wafer 13 in the middle of manufacturing process of semiconductor devices is held by the top ring 14. The surface to be polished of the wafer 13 is opposed to the polishing cloth 12 attached to the polishing platen 11. At the time of polishing, the wafer 13 is subjected to a given load by the top ring 14. Thus, the surface to be polished of the wafer 13 is pressed against the polishing cloth 12.

At the time of polishing, the top ring 14 and the polishing platen 11 are rotated by the motors 15 and 16, respectively. A polishing slurry is applied to the polishing cloth 12. Thereby, the surface of a film deposited over semiconductor devices formed on the wafer 13 is polished gradually. The film surface is smoothed until a target thickness is reached. The film thickness is measured by the film thickness measuring instrument 22.

Here, an example of a method of determining the pulse repetition rate of the film thickness measuring radiation will be described. For example, assuming that the number of rotations of the motor 15 is RTT (rpm) and that of the motor 16 is RTR (rpm), the least common multiple R of RTT and RTR is determined first. Then, the pulse repetition rate $\lambda$ (Hz) of the film thickness measuring radiation is determined as $$\lambda = 60 \, n/R \tag{1}$$

where n is an integer.

Prior to polishing, the position of the measuring radiation irradiation device 21 is adjusted by the alignment device 25 so that the film thickness measuring radiation (for example, visible light) 24 from the irradiation device 21 will be directed through the measuring window 17 onto a specified site on the semiconductor device surface. Under this condition, when the polishing platen 11 and the top ring 14 are started to rotate by the motors 15 and 16, respectively, that specified site on the semiconductor device surface will move past the film thickness measuring window 17 every 1/R. If, therefore, the visible light 24 of the pulse repetition rate $\lambda$ is emitted at the times when the specified site on the semiconductor device surface moves past the measuring window 17, then reflections will be obtained only from that specified site. The analysis of the reflection dates allows the thickness of the polished film at the specified place to be measured accurately.

As the film thickness measuring radiation use may be made of ultraviolet radiation. X-rays may also be used particularly for films of metal.

The visible light 24 is emitted in the form of pulses the repetition rate of which is $\lambda$ and the emitting interval is represented by m/$\lambda$ where m is an integer. The measuring radiation need not be emitted at regular intervals but may be emitted with m set variable. In this case, m need not necessarily be varied consecutively but may be varied non-consecutively like 1, 2, 4, 6, . . . .

For measurement of film thickness, it is required to change the pulse repetition rate ($\lambda$) at which the visible light 24 is emitted within a certain range. The range of the pulse repetition rate $\lambda$ can be determined from the film thickness anticipated in advance. In this case, the time required to measure the film thickness can be reduced.

The film thickness measuring window 17 is not subject to any limitation to the shape and size but can take various forms.

As described above, at the time of polishing, film thickness measuring radiation is directed at a specific pulse repetition rate onto the surface to be polished of a wafer having semiconductor devices formed, thereby allowing the thickness at a specified site of a to-be-polished film to be measured exactly. Thus, the amount by which the film is polished can be managed strictly, allowing good control of the residual thickness of the polished film. As a result, the formation of form defects in the polished film due to short or excessive polishing can be prevented, ensuring quality and reliability of the semiconductor devices.

When the film thickness measuring radiation used is visible light, it is possible to measure the thickness of thick films, such as of silicon oxide, that allow light to pass through. When the measuring radiation is ultraviolet radiation, it is possible to measure the thickness of thin films, such as of silicon oxide, that allow light to pass through. When the measuring radiation is X-rays, it is possible to measure the thickness of metal films.

Second Embodiment

Figure 3:
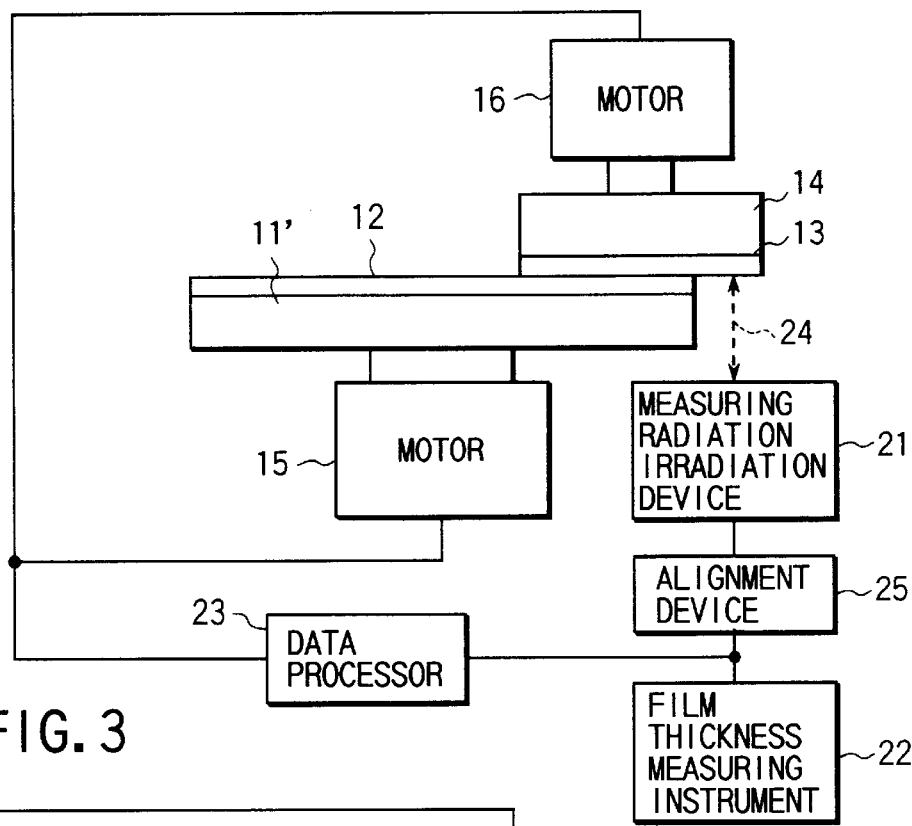
FIG. 3 is a schematic illustration of a semiconductor polishing apparatus according to a second embodiment of the present invention.

FIG. 3 is a schematic illustration of a semiconductor polishing apparatus according to a second embodiment of the present invention. In the second embodiment, a wafer is placed so that its portion protrudes from the outer edge of the platen and film thickness measuring radiation is directed onto that portion of the wafer. In FIG. 3, like reference numerals are used to denote corresponding parts to those in FIG. 2.

As shown in FIG. 3, a wafer 13 is held by a top ring 14 so that its portion protrudes from the outer edge of a polishing platen 11' to which a polishing cloth 12 is attached. A measuring radiation irradiation device 21 is installed so as to allow the overhang of the wafer 13 to be irradiated with film thickness measuring radiation.

Even in the second embodiment thus configured, as in the first embodiment, the film thickness at a specified site on a film being polished in the surface of semiconductor devices can be measured accurately by determining the pulse repetition rate of the film thickness measuring radiation so that only reflections from the specified site on the polished film can be acquired.

The second embodiment differs from the first embodiment only in that the film thickness measuring radiation is directed onto that portion of the wafer 13 which protrudes from the outer edge of the polishing platen 11'. That is, the present invention can be practiced even in the case where the polishing platen has no film thickness measuring window.

Third Embodiment

Figure 4:
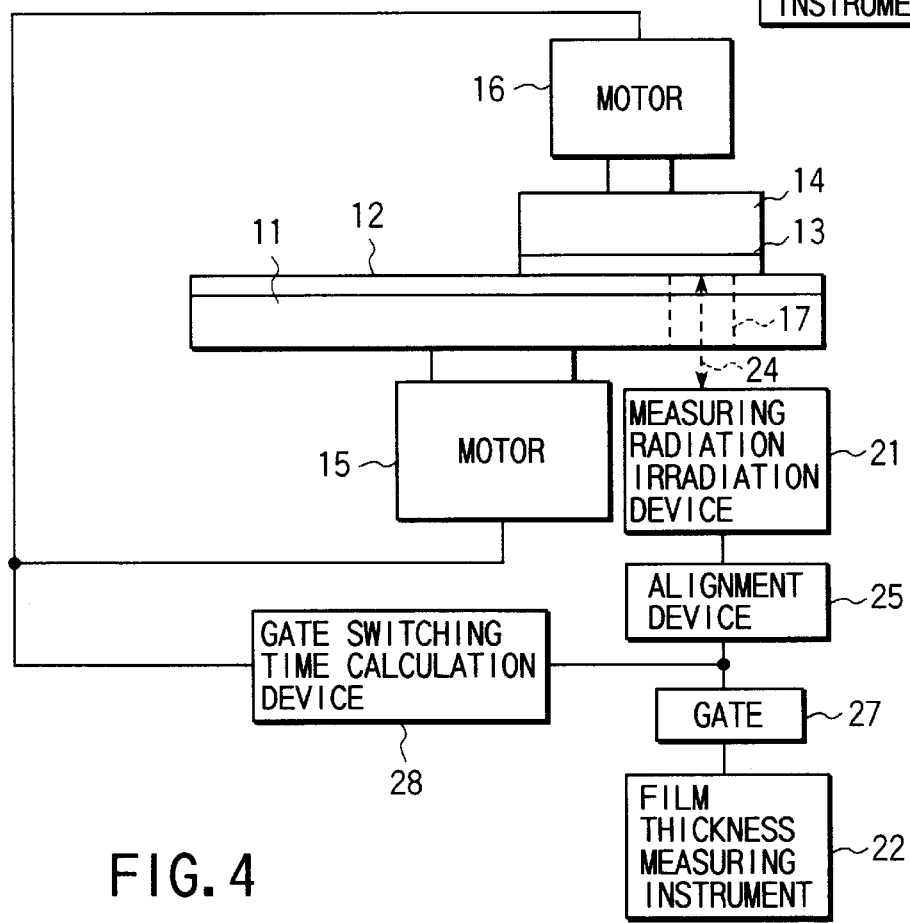
FIG. 4 is a schematic illustration of an example of a semiconductor polishing apparatus according to a third embodiment of the present invention.

FIG. 4 is a schematic illustration of a semiconductor polishing apparatus according to a third embodiment of the present invention. In the third embodiment, reflection data are fed via a gate into a film thickness measuring instrument. In FIG. 4, like reference numerals are used to denote corresponding parts to those in FIG. 2.

As shown in FIG. 4, a film thickness measuring instrument 22 is preceded by a gate 27, the timing by which the gate 27 is opened and closed being controlled by a gate switching time calculation device 28. At the time of film thickness measurement, the gate switching time calculation device 28 controls the gate 27 so that it opens in synchronization with a specific frequency calculated on the basis of the numbers of rotations of motors 15 and 16 but with a delay time corresponding to the time required for reflection data to reach the gate.

Even in the third embodiment thus configured, as in the first embodiment, the film thickness at a specified site on a film being polished in the surface of semiconductor devices can be measured accurately by determining the timing by which the gate is opened and closed so that only reflections from the specified site on the polished film can be acquired.

Moreover, even in the case where the reflection data are accumulated and integrated in the film thickness measuring instrument 22, increasing amounts of information can be adjusted arbitrarily. Thereby, the accuracy of film thickness measurements can be increased without increasing the amount of information so much.

The rate λ' at which the gate 27 is opened and closed is given, as in the first embodiment, by $$\lambda' = 60 \; n/R \qquad (2)$$

where n is an integer.

The switching interval of the gate 27 is represented by m/λ' where m is an integer. The gate need not be switched at regular intervals but may be switched with m set variable. In this case, m need not necessarily be varied consecutively but may be varied non-consecutively like 1, 2, 4, 6, . . . .

Figure 5:
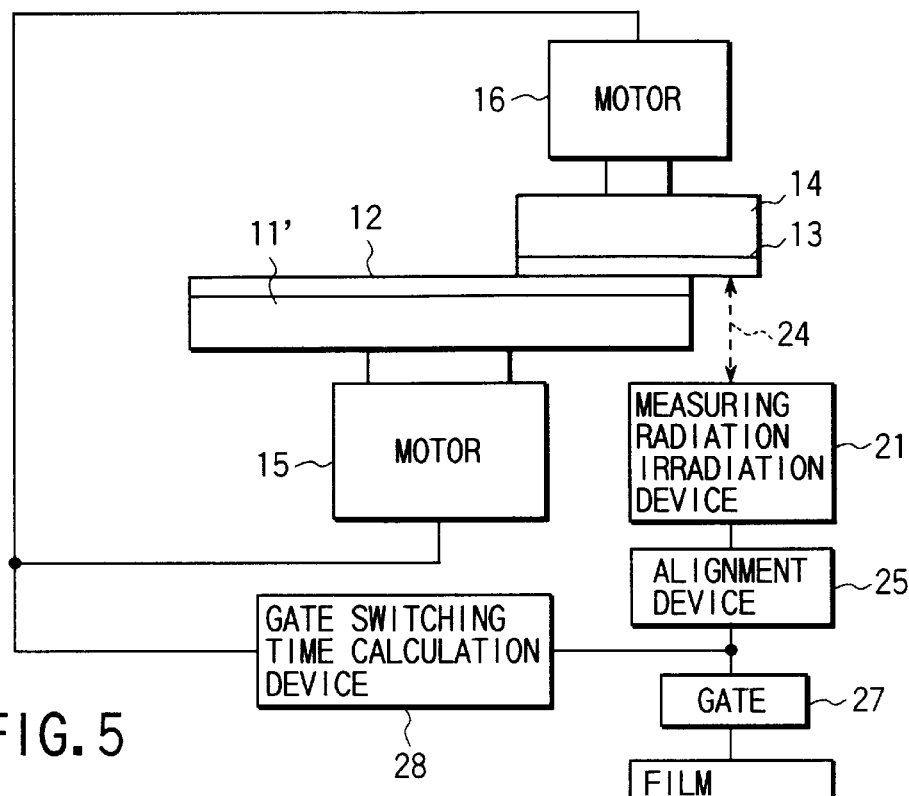
FIG. 5 is a schematic illustration of another example of the semiconductor polishing apparatus according to the third embodiment of the present invention.

The third embodiment can be applied not only to the semiconductor polishing apparatus of the first embodiment but also to the semiconductor polishing apparatus of the second embodiment (see FIG. 3) as shown in FIG. 5. That is, even in the case of a polishing platen 11' with no film thickness measuring window, substantially the same effectiveness as with a polishing platen having a film thickness measuring window can be expected.

Figure 6:
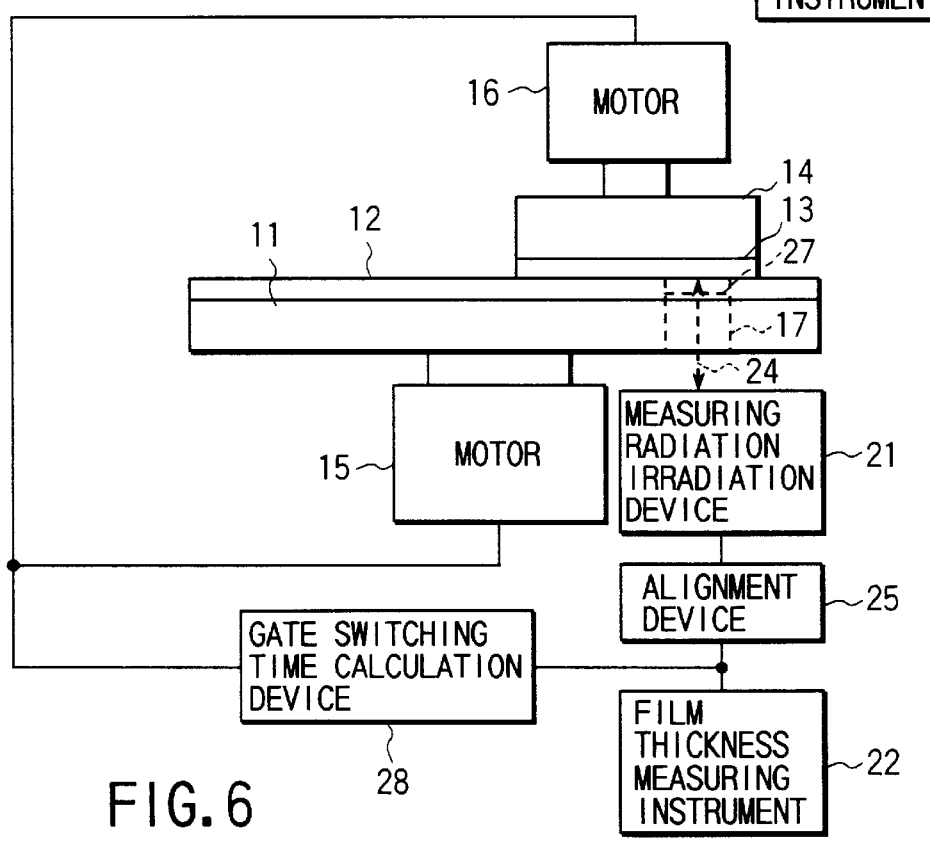
FIG. 6 is a schematic illustration of still another example of the semiconductor polishing apparatus according to the third embodiment of the present invention.

The gate 27 need not necessarily be placed to immediately precede the film thickness measuring instrument 22 but may be provided, as shown in FIG. 6, in the film thickness measuring window 17 formed in the polishing platen 11.

Fourth Embodiment

Figure 7:
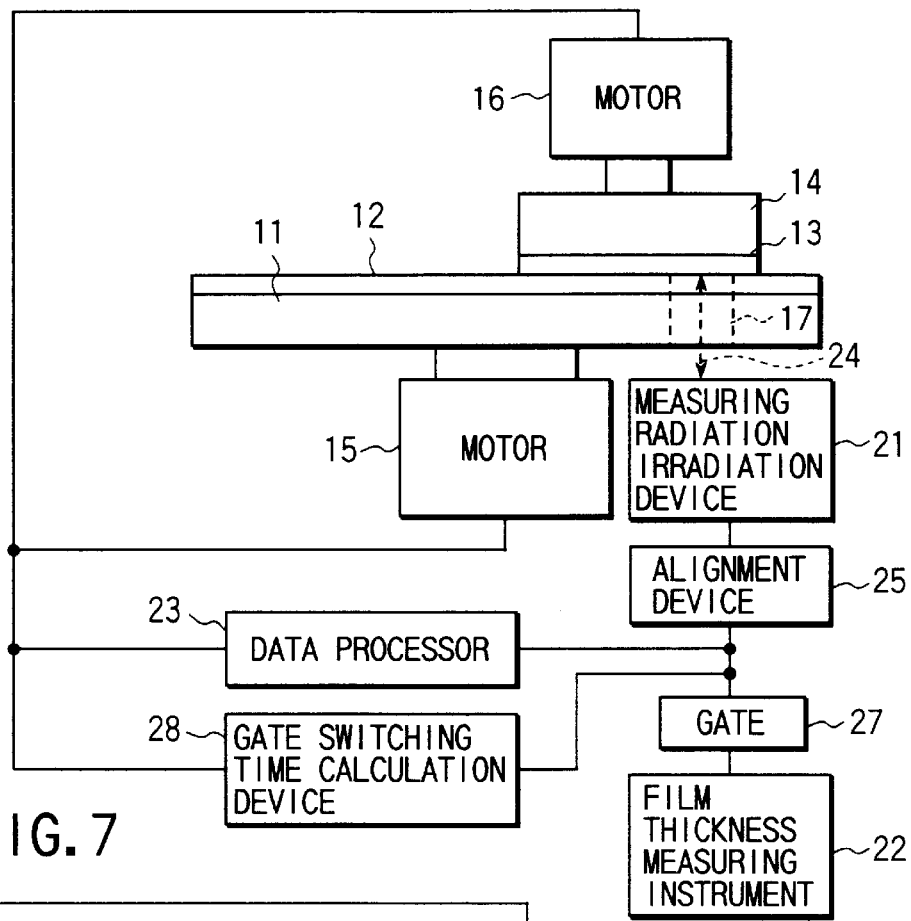
FIG. 7 is a schematic illustration of a semiconductor polishing apparatus according to a fourth embodiment of the present invention.

FIG. 7 is a schematic illustration of a semiconductor polishing apparatus according to a fourth embodiment of the present invention.

As shown in FIG. 7, the fourth embodiment is configured such that the gate 27 and the gate switching time calculation device 28 used in the third embodiment are added to the semiconductor polishing apparatus of the first embodiment shown in FIG. 2.

Of course, the gate 27 and the gate switching time calculation device 28 can be added to the semiconductor polishing apparatus of the second embodiment shown in FIG. 3.

In either configuration, the gate 27 need not necessarily be placed immediately before the film thickness measuring instrument 22 but may be provided in the film thickness measuring window 17 formed in the polishing platen 11 as shown in FIG. 6.

Fifth Embodiment

Figure 8:
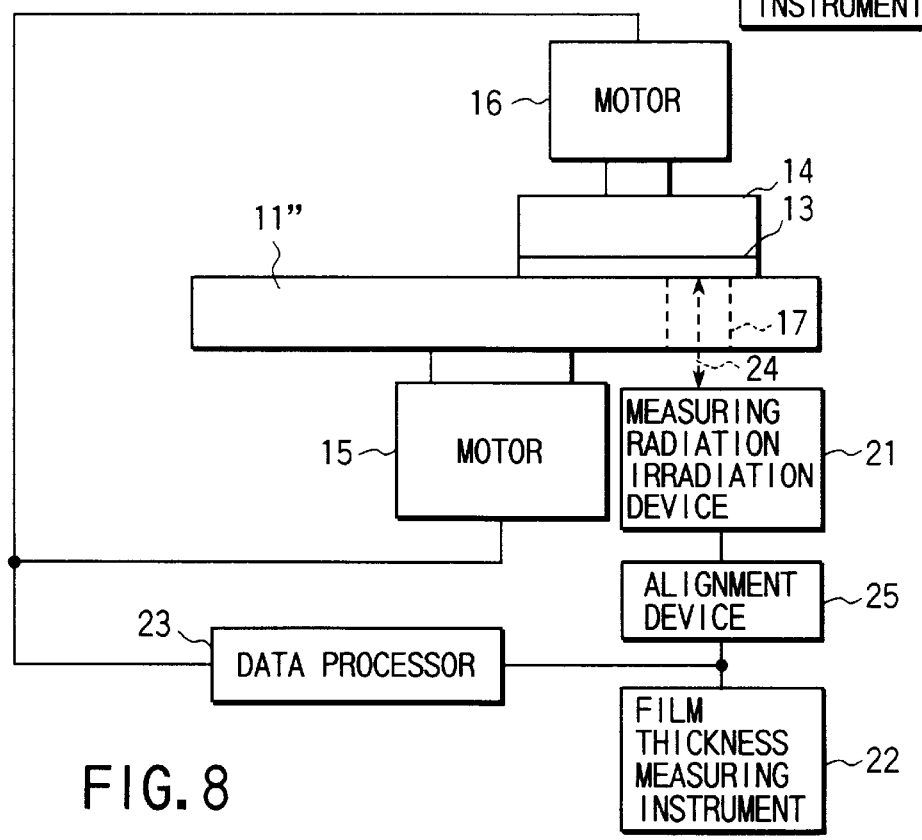
FIG. 8 is a schematic illustration of a semiconductor polishing apparatus according to a fifth embodiment of the present invention.

FIG. 8 is a schematic illustration of a semiconductor polishing apparatus according to a fifth embodiment of the present invention.

The first through fourth embodiments have been described in terms of a type of semiconductor polishing apparatus in which, at the time of polishing, a polishing slurry is applied to the surface of a polishing cloth attached to a polishing platen. This is not restrictive. The semiconductor polishing apparatus of each of the first through fourth embodiments may be of such a type as shown in FIG. 8 in which the surface of a polishing platen 11" is formed into a polishing surface and neither polishing cloth nor polishing slurry is used.

The first through fifth embodiments described so far are adapted to achieve optimum polishing while measuring the thickness of a film in the middle of polishing by film thickness measuring instrument. Therefore, the need for analysis software that requires complex processing is eliminated and adjustment work required with each version of the software becomes unnecessary, increasing the efficiency of apparatus and ensuring ease of apparatus management.

According to the present invention, as described above, the thickness of a specified portion of a film in the middle of polishing can be measured accurately and the amount by which the film is polished can be managed strictly. Thus, the residual thickness of the polished film in the surface of semiconductor devices can be controlled well and a semiconductor polishing apparatus and method which ensure ease of management can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor polishing method, comprising:

setting a surface to be polished of a wafer held by a wafer holder opposite to the surface of a polishing cloth attached to the surface of a polishing platen;

supplying the surface of the polishing cloth with a polishing slurry;

polishing a film present in the surface of the wafer by bringing the surface of the polishing cloth and the surface of the wafer into contact with each other with a load applied to the wafer;

irradiating the surface of the wafer with measuring radiation at the time of polishing from a measuring radiation irradiation device;

measuring the thickness at a specified site of the film in the middle of polishing on the basis of reflections of the measuring radiation from the surface of the wafer by a film thickness measuring device; and controlling the timing of opening and closing a gate for conducting the reflections to the film thickness measuring device by a gate control device.

2. The semiconductor polishing method according to claim 1, wherein the gate is opened at a specific frequency calculated from the number of rotations of a first motor for rotating the polishing platen and the number of rotations of a second motor for rotating the wafer holder but with a delay time corresponding to the time required from the reflections to reach the gate.

3. The semiconductor polishing method according to claim 1, wherein the gate is provided immediately before the film thickness measuring device.

* * * * *